(12) United States Patent
Pehlke

(10) Patent No.: US 6,522,194 B1
(45) Date of Patent: Feb. 18, 2003

(54) ENVELOPE RESTORATION SCHEME FOR LINEAR HIGH-EFFICIENCY POWER AMPLIFICATION

(75) Inventor: David R. Pehlke, Chapel Hill, NC (US)

(73) Assignee: Ericsson Inc., Research Triangle Park, NC (US)

( * ) Notice: Subject to any disclaimer, the term of this patent is extended or adjusted under 35 U.S.C. 154(b) by 152 days.

(21) Appl. No.: 09/752,052

(22) Filed: Dec. 29, 2000

(51) Int. Cl.$^7$ .................................................. G03C 3/00
(52) U.S. Cl. ........................ 330/10; 330/151; 330/277; 330/305; 330/306
(58) Field of Search ........................ 330/10, 277, 305, 330/307, 151, 306

(56) References Cited

U.S. PATENT DOCUMENTS

| | | | |
|---|---|---|---|
| 4,717,884 A | | 1/1988 | Mitzlaff |
| 5,329,259 A | | 7/1994 | Stengel et al. |
| 5,467,055 A | | 11/1995 | Wray et al. |
| 5,535,438 A | * | 7/1996 | Sevic ........................ 455/110 |
| 6,166,601 A | * | 12/2000 | Shalom et al. ............... 330/151 |
| 6,366,177 B1 | * | 4/2002 | McCune et al. ............. 332/103 |
| 6,392,488 B1 | * | 5/2002 | Dupuis et al. ............... 330/277 |

OTHER PUBLICATIONS

Cox, D. C. "Linear Amplification with Nonlinear Components". *IEEE Transactions on Communications*, Dec. 1974, np.

Sundström, L. et al. "Effect of Modulation Scheme on LINC Transmitter Power Efficiency". *Electronics Letters* Sep. 29th 1994, vol. 30, No. 20, pp. 1643–1645.

Bateman, Andrew et al. "Implementation of the LING Transmitter Using the Combined Analogue Locked Loop Universal Modulator (CALLUM)". *Mobile and Personal Communications* Dec. 13–15, 1993, Conference Publication No. 387, pp. 31–37, ©IEE 1993.

Kahn, Leonard. "Single–Sideband Transmission by Envelope Elimination and Restoration". *Proceedings of the IRE*, Jan. 16, 1952, pp. 803–806.

Raab, Frederick H. "Intermodulation Distortion in Kahn–Technique Transmitter". *IEEE Transactions on Microwave Theory and Techniques*, vol. 44, No. 12, Dec. 1996, pp. 2273–2278; TP 3.6–1 to 3.6–10. ©IEEE 1998.

Hashjani, Tirdad Sowlati. "Class E Power Amplifiers for Wireless Communications". Thesis submitted for the degree Doctor of Philosophy, Dept. of Electrical and Computer Engineering, Univ. of Toronto, 1996. © Tirdad Sowlati Hashjani, 1996.

Sokal, Nathan O. "Class E–A New Class of High–Efficiency Tuned Single–Ended Swithching Power Amplifiers". *IEEE Journal of Solid–State Circuits*, vol. SC–10, No. 3, Jun. 1975, pp. 168–176.

(List continued on next page.)

*Primary Examiner*—Patricia Nguyen
(74) *Attorney, Agent, or Firm*—Coats & Bennett, P.L.L.C.

(57) ABSTRACT

A apparatus for providing a waveform as a switched input into an output matching network of a standard class E amplifier. The apparatus includes a switch in communication with the input and the combining device receiving amplitude and phase information from the primary waveform. The combining device functions to combine the amplitude and phase information to create a control signal which is used to control the switch and create a secondary waveform for input to the matching network. In this way, an amplitude modulated waveform is amplified at high efficiency, enabling application of either all or part of the phase and/or amplitude modulation at the input of the amplifier.

29 Claims, 4 Drawing Sheets

OTHER PUBLICATIONS

Raab, Frederick H. "Idealized Operation of the Class E Tuned Power Amplifier". *IEEE Transactions on Circuits and Systems*, vol. CAS–24, No. 12, Dec. 1977. Submitted as an unpublished manuscript, revised Jul. 1977, pp. 727–735.

Zulinski, Robert E. et al. "Class E Power Amplifiers and Frequency Multipliers with Finite DC–Feed Inductance". *IEEE Transactions on Circuits and Systems*, vol. CAS–34, No. 9, Sep. 1987, pp. 1074–1087.

Raab, Frederick H. "Effects of Circuit Variations on the Class *E* Tuned Power Amplifier". *IEEE Journal of Solid–State Circuits*, vol. SC–13, No. 2, Apr. 1978, pp. 239–244f.

Vidkjaer, Jens. "A Computerized Study of the Class–*C* – Biased RF–Power Amplifier". *IEEE Journal of Solid–State Circuits*, vol. SC–13, No. 2, Apr. 1978, p. 247ff.

\* cited by examiner

ENVELOPE RESTORATION SCHEME FOR LINEAR HIGH-EFFICIENCY POWER AMPLIFICATION

BACKGROUND OF THE INVENTION

The present invention relates to power amplifiers. In particular, the invention relates to a system and apparatus utilizing an input modulation scheme for linear high efficiency power amplification.

The present invention also relates to efficient amplification of signals whose envelope is amplitude modulated, and specifically the application of linear amplification at RF frequencies of such signals up to high power levels.

In applications that are constrained by limited available DC power (say from a fixed capacity battery power supply), there is a challenge to tailor the waveforms present at the active device output (at any given stage along the chain of amplification) such that power is not dissipated within the active device and is retained for the conversion from DC to RF signal energy. The less power dissipated within the active device, the higher the efficiency of the amplifier. Dissipated power within the active device occurs when there is a simulataneous overlap of non-zero voltage and current of the carrier signal at the output terminal of that device. This product of non-zero voltage and current is wasted energy that detracts from the intended output signal power at the carrier frequency and degrades efficiency. Various techniques and amplifier topologies exist which minimize the finite overlap of current and voltage to a varying degree, and these may be applied in combination with the proposed invention for maximum efficiency when finite amplitude modulation is required.

In applications that also require linear amplification of desired signals, the same clipping that enhances efficiency may degrade linearity. The requirement for an amplified replica of the input signal is difficult to achieve if the waveform is "clipped" or distorted.

This distortion affects certain aspects of the input signal more than others. Just as the input signal can be described to have an amplitude modulation and phase modulation, the distortion can be described as a matrix which when multiplied by those amplitude modulation and phase modulation components will yield the resultant amplitude modulation and phase modulation components at the output. For example, $$\begin{bmatrix} AM_o \\ PM_o \end{bmatrix} = \begin{bmatrix} AM_o/AM_i & AM_o/PM_i \\ PM_o/AM_i & PM_o/PM_i \end{bmatrix} \cdot \begin{bmatrix} AM_i \\ PM_i \end{bmatrix}$$

For certain signals which do not contain any amplitude modulation and only carry information through PM information, the only term of significance in this equation is the $PM_o/PM_i$ term. Often the phase changes induced from a purely phase-modulated input signal do not induce large phase distortion even in very nonlinear amplifiers. Accordingly, a very efficient nonlinear power amplifier can be used to amplify the phase-modulated input without significant degradation in the critical phase information.

This is not the case for amplitude-modulated signals, however, wherein a large envelope amplitude can induce significant amplitude distortion as a result of amplifier nonlinearities. Large changes in amplitude at the device input typically cause large changes in the device capacitances and conductances, all of which vary nonlinearly. These nonlinear conductance and capacitance changes result in significant distortion of the waveform seen at the output. This distortion ultimately degrades the ability of the power amplifier to meet the linearity requirements of its application. At the same time, the efficiency benefits of operating an amplifier nonlinearly are significant, and thus the use of nonlinear amplifiers to linearly amplify signals with strong amplitude modulation has been an area of much study.

Established approaches exist to restore the amplitude modulation envelope on the output of a nonlinear amplification stage, which is itself able to achieve a very high efficiency, and therefore the system solution modulating that core amplifier is able to attain high efficiency. Such approaches generally rely on the use of a phase-modulated signal of constant envelope at the amplifier input. The nonlinear amplifier can efficiently amplify the phase modulation component without AM/AM and AM/PM distortion. The amplitude modulation envelope information is then restored at the amplifier output without inducing amplitude distortion at that stage. One well-known approach for separately amplifying amplitude and phase information is Linear Amplification Using Nonlinear Components (LINC). The technique utilizes a pair of amplifier chains, each operating on constant-envelope signals whose relative phase is varied such that their sum results in a desired envelope having varying amplitude. The power combining of the two chains at their output sums the coherent parts of each waveform and places that result on the output. The destructive interference between the two signals is dissipated in the termination resistor of the power combining element. This dissipation can significantly degrade the efficiency of the overall amplifier, especially when the two signals are signficantly out of phase in order to reach a minimum desired output amplitude.

Envelope Elimination and Restoration (EER), or Kahn-technique transmission, is also well-known. Like LINC, EER involves the use of a constant envelope phase modulated input signal. EER, however, restores the amplitude modulated envelope information directly on the supply line of the output DC supply. By directly modulating the supply voltage on the output, the resultant waveform consists of the amplified phase information to a saturated level defined by the supply voltage. The output then restores the envelope by becoming the upper and lower limits within which the amplified phase waveform is bracketed. Modulation of the supply voltage can be problematic, however, as the spurious output of the switching regulator can interfere significantly with the desired envelope. Furthermore, to minimize the effect of the switching regulator interference, it must be switched at a high rate and the intermodulation spurs at its output must be filtered down to very low frequency. As a result, if a feedback loop is required in order to correct for amplitude distortion, the bandwidth of that loop is constrained to be extremely small and unusable for wide bandwidth channel communications.

There is therefore a need for an improved envelope restoration scheme that overcomes the limitations of power combining losses in LINC, and the switching regulator limitations in standard EER/Kahn implementations.

BRIEF SUMMARY OF THE INVENTION

In accordance with the present invention, the preferred embodiments described herein provide an apparatus and method for creating a quantized waveform based on received phase and amplitude information from an input signal. In particular, the present invention may be embodied in an active switching circuit for providing a switched waveform input to a standard class E output load matching network in a class E amplifier. The circuit includes a switch in communication with the input and the combining device receiving amplitude and phase information from the primary waveform. The amplitude and phase information may be received independently from each other. The combining device functions to combine the amplitude and phase information to create a control signal which is used to control the switch and create a secondary waveform or input to the matching network.

In another aspect of the invention, a low-pass filter and a high-pass filter are provided to receive amplitude and phase information, respectively, from the primary waveform. The filters share a common output linked with the switch. The amplitude and phase information are combined to control the switch and create a secondary waveform for input into the output load matching network. In yet another aspect of the invention, the circuit that provides the switched input includes a switch and a multiplying device in communication with the switch that receives amplitude and phase information from a primary waveform. The amplitude and phase information are received independently from each other. The multiplying device multiplies the amplitude and phase information to create a control signal. The control signal is used to control the switch to create a secondary waveform for input into the matching network.

The invention may also be embodied in a method for providing a waveform for input into the output load matching network of a standard class E amplifier. The method includes the steps of separating phase and amplitude information from a primary waveform, receiving the information into a combining device, combining the amplitude and phase information to create a control signal, controlling an electric current through a switch to create a secondary waveform from the control signal, and providing the secondary waveform as an input to the matching network.

In another aspect of the invention, a method is provided wherein phase and amplitude information are separated from a primary waveform. The amplitude information is passed through a low-pass filter, and the phase information is passed through a high-pass filter. The amplitude and phase information are then combined to create a control signal, which in turn controls a switch to create a secondary waveform. The secondary waveform is provided as an input to the matching network.

Advantages of the present invention will become readily apparent to those skilled in the art from the following description of the preferred embodiments of the invention which have been shown and described by way of illustration. As will be realized, the invention is capable of other and different embodiments, and its details are capable of modifications in various respects. Accordingly, the drawings and description are to be regarded as illustrative in nature, and not as restrictive.

DETAILED DESCRIPTION OF THE INVENTION

Figure 1:
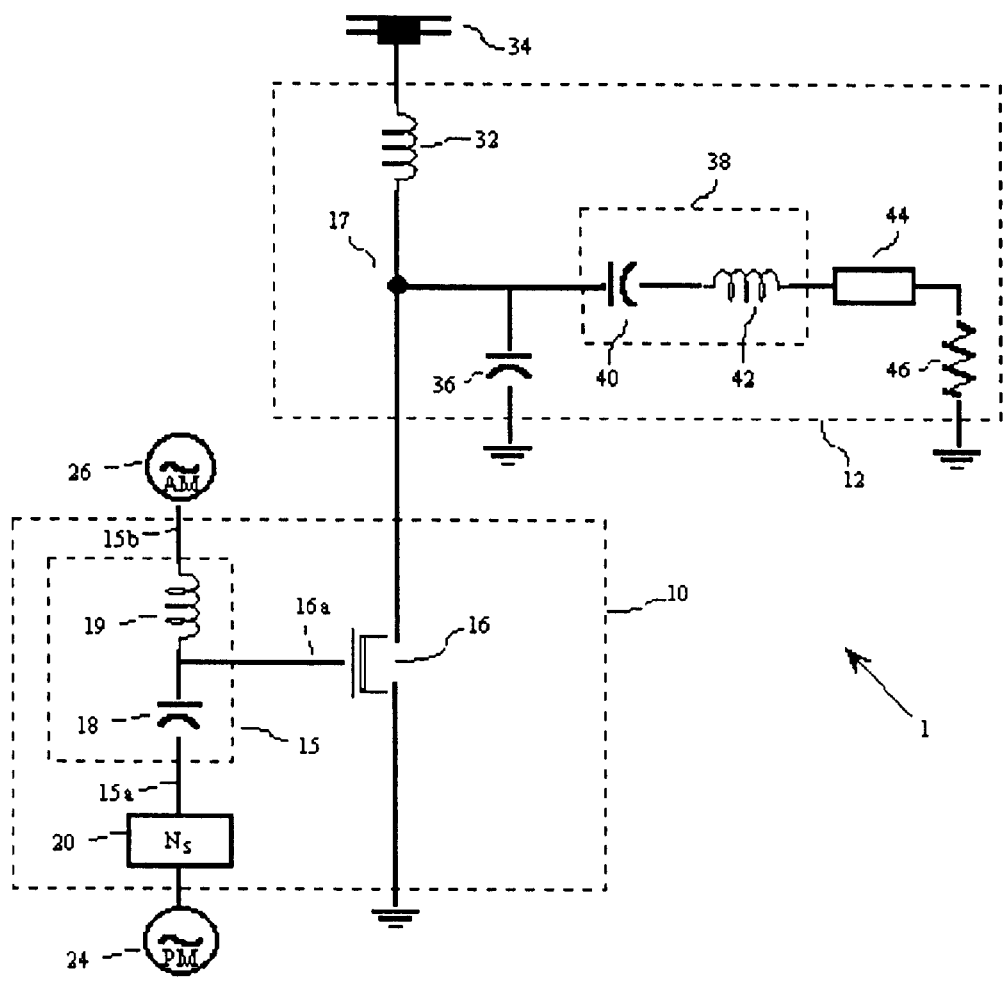
FIG. 1 is a schematic diagram of a first embodiment of a circuit implementing the present invention.

Turning now to the drawings, wherein like numeral designate like components, FIG. 1 is a diagram of a active device switching circuit 10 combined with an output load matching network 12 to make up an amplifier 1.

The circuit 10 preferably includes a single switching device 16 linked to a tuned filter 15. The switching device 16 should be a lower minimum "ON" resistance device with high-speed switching capabilities, one example would be the 2SK2922 LDMOS RF discrete FET transistor manufactured by Hitachi, Inc. (http://www.hitachi.co.jp/Sicd/English/Products/transise.htm). These devices are exemplary only for this embodiment, and a wide variety of other components or structures may be substituted for the components described in accordance with the knowledge of one skilled in the art. The filter 15 preferably includes a capacitance 18 and an RF choke coil 19 linked in series and through their central connection node to the gated input 16a to the switching device 16. These devices are exemplary only, and a wide variety of other components or structures may be substituted for the components described in accordance with the knowledge of one skilled in the art.

The filter 15 utilizes the capacitance 18 and the RF choke 19 for summation of the combined DC envelope and RF phase waveforms. Using this preferred configuration to combining the waveforms, the variation in "ON" voltage is small and the "ON" resistance can in turn be controlled with a minimum of distortion.

The switching device 16 is in turn linked as shown to the load network input 17 of the amplifier 12. The gate 16a of the switching device 16 receives a combined input of phase information 24 and amplitude information 26 that are input into the filter 15 through inputs 15a and 15b, respectively, from a primary waveform. A matching network 20 is linked to input 15a to provide optimum power transfer from the phase modulated source through the tuned filter to the input gate 16a of the switching device 16. The matching network 20 may comprise a number of reactive elements according to known methods. The received information 24 and 26 is utilized to vary the switching resistance of the switching device 16 in accordance with the input primary waveform to create a secondary waveform for the amplifier input 17.

The embodiment described here is a class E implementation for extremely high efficiency and other listed advantages, although other embodiments for the invention may consist of class C, or other amplifier modes of operation. A standard class E amplifier comprises a single transistor switch and the same output load matching network 12 as shown in the first embodiment of FIG. 1. The connection node 17 between the active switch device 10 and this standard class E output load matching network 12 comprises an inductance coil 32 connecting to the supply voltage Vdd 34. A capacitance 36 which includes parasitic capacitance from the active device is connected in parallel with the active device output impedance. A tuned circuit filter 38 consisting of a capacitance 40 and an inductance 42 is connected in series with a reactive component 44 and a load resistance 46, nominally 50 Ohm. Typically, frequency and phase modulation information is received from the switch at node 17, and amplitude modulation information is received by variation of the supply voltage Vdd at 34. However, in the present case, as will be described below, the phase and amplitude information 24 and 26 are both received as a switched input at 16a and are combined to produce a desired signal at node 17, such that the final signal delivered to the load 46 is as desired.

During operation, the active switching device 16 is gated on and off through the gate 16a in accordance with the combined received phase and amplitude information 24 and 26. Given that the device 16 switches at an RF frequency between an entirely off state to an entirely on state, the output across the load resistance 46 of the matching network 12 is determined by the modulated "ON" resistance of the switching device 16. The switch 16 can thus be driven with a low frequency signal so that the "ON" resistance of the switch 16 produces a flexibly adjusted output amplitude and thus restores the output envelope amplitude.

The switching device 16 slowly varies the envelope information. The function of this information in the switch configuration of the circuit 10 provides additional isolation of the RF feedthrough between the high-speed switching of the phase information input and the node connected to the load network.

The present switching circuit 10 advantageously allows a single RF input into the matching network 12 and a low-frequency baseband envelope input to achieve the variable "ON" resistance necessary for input into the matching network 12. This reduces the necessity for multiple RF inputs and associated high-frequency signal lines on valuable circuit board real estate. Furthermore, the requirement for multiple matching networks or multiplexing functions preceding the actual matching network 12 are not required.

The adjustment of the switch 16 to a higher total "ON" resistance will decrease the output amplitude and power, but also the related power-added efficiency of the amplifier 1. In typical class E amplifiers, significant efficiencies can be achieved even for the higher "ON" resistance states. Because of this fact, the operation of the amplifier 1 under back-off can result in efficient amplification down to even low output powers for the same fixed power supply voltage. Thus, significant gains in efficiency can be achieved with discrete voltages from a switched power supply regulator made active for low power levels. Thus, the present circuit 10 allows for changes in the power supply voltage without any need for modifications in the load network and the output power will scale with the fixed power supply to continue to provide peak efficiency.

Figure 2:
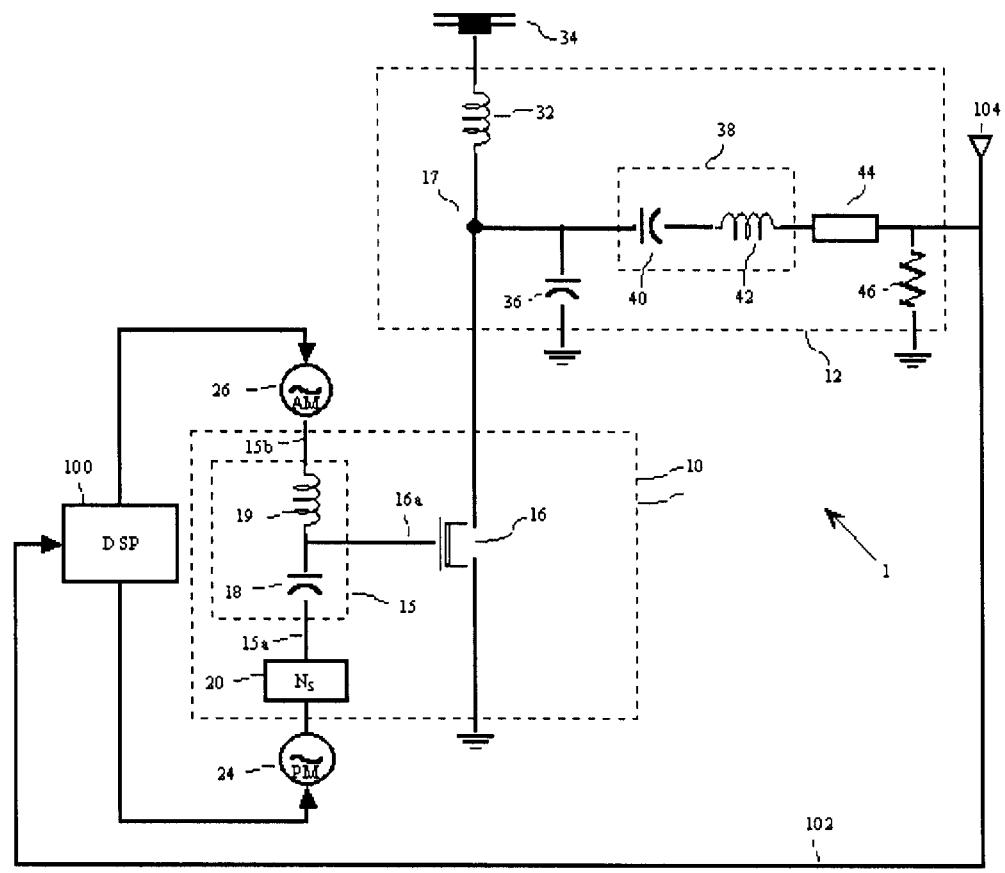
FIG. 2 is a schematic diagram illustrating a modification to the circuit shown in FIG. 1.

In the present embodiment, there is some predistortion required to input the correct waveform to the switch 16 to achieve the desired output waveform from the amplifier 1. A unique input waveform for any given desired output may be defined so that a baseband digital signal processor can properly generate the corrected input waveform. A circuit to accomplish this is depicted in FIG. 2, showing a digital signal processor 100 being input into the switch input 16a. This predistortion may be generated by conventional methodology known in the art. In the alternative, an additional feedback loop may be implemented to periodically update the input-to-output relationship in accordance with any long-term degradation requirements. For instance, a feedback loop 102 may be used to sense any voltage standing wave ratio ("VSWR") reflection from the antenna 104. The feedback loop may then control the digital signal processor 100 to adjust the phase and amplitude information 24 and 26 to correct for any VSWR reflection before the amplitude information is received by the switch 16a.

In an alternative embodiment, the circuit 10 may be of a differing configuration to provide a multiplication of the envelope and phase waveforms 26, 24 into gate 16a of the switching device 16. Although the two signals (amplitude and phase) are still intermixed in this embodiment, varying differences in performance may be achieved.

Figure 3:
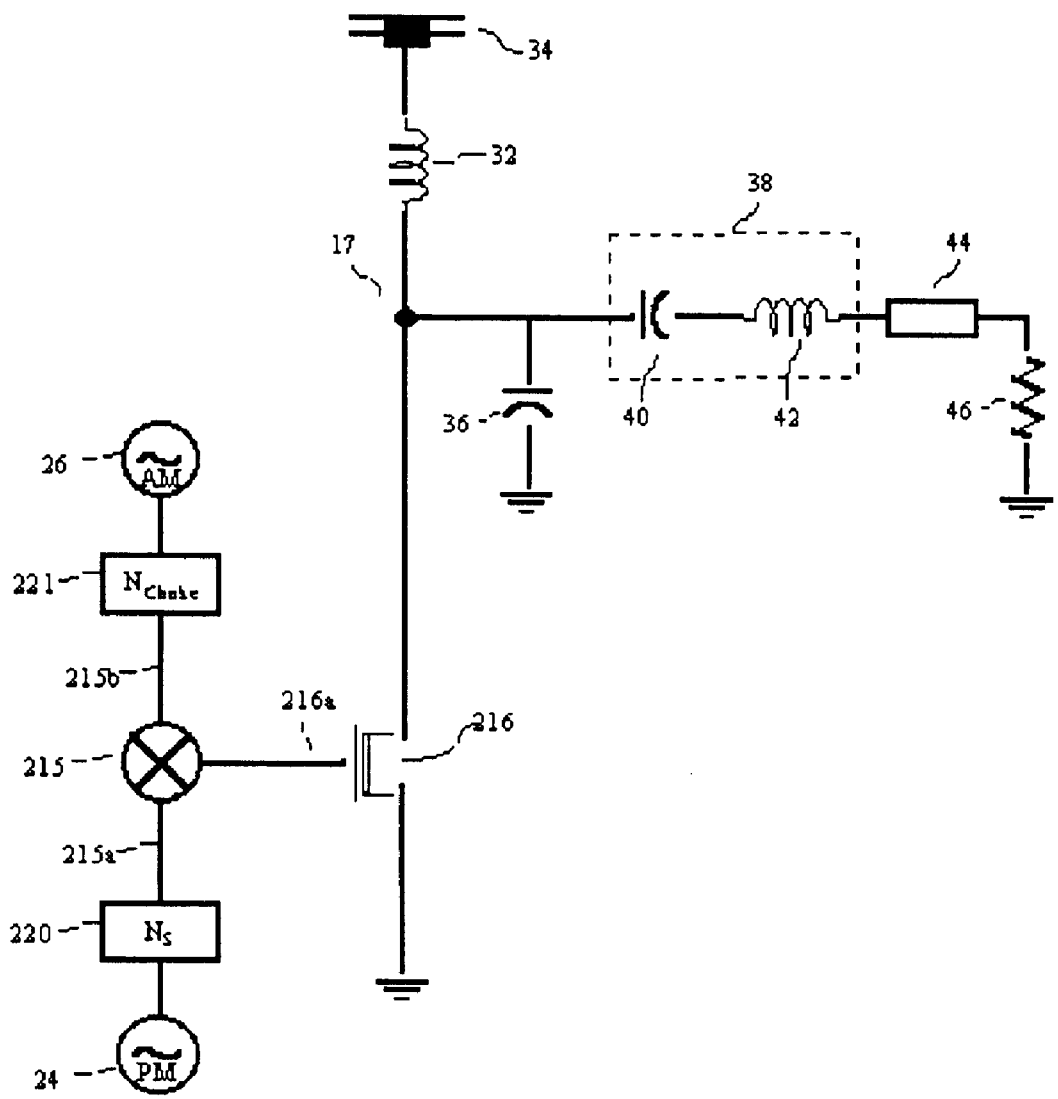
FIG. 3 is a diagram illustrating a second embodiment of a circuit implementing the present invention.

A second embodiment utilizing a multiplying mixer is shown in the schematic diagram of FIG. 3. As shown in the Figure, mixer 215 is provided to combine the phase and envelope waveforms from the linked inputs 215a and 215b. A matching network 220 is linked to input 215a to provide optimum power transfer from the phase modulated source through the tuned filter to the input gate 216a of the active switching device 216. The matching network 220 may comprise a number of reactive elements according to known methods. Another matching network 221 is linked to input 215b to block any phase information from reaching the amplitude modulated source, while still providing a low frequency path from the amplitude modulated source to the gate 216a of the active switching device 216. This second matching network also may comprise a combination of reactive elements according to known methods.

The combined signal is fed at 216a to the gate of the switching device 216. In this embodiment, the multiplying mixer 215 allows both the upper limit and the lower limit of the combined square wave phase waveform input at 216a to expand and contract together. This has little implication for the "OFF" state. More critically, however, the amplitude control of the mixer output must achieve the precise "ON" voltage to achieve the exact "ON" resistance. This requires the output amplitude of the mixer 215 to be very accurate.

The overall phase distortion due to variations in the output supply voltage of switching regulator based EER implementations is alleviated in the present embodiments. This is due to the fact that the parasitic capacitance does not vary with output DC voltage in the active switching device. The output supply remains constant. The addition of switching devices, however, does increase the total "nonlinear" parasitic capacitance required at the input to the loading network, and as such would be susceptible to changes in the average DC value. But in the present embodiments the "average" DC value is maintained at the battery voltage without change.

A significant advantage of this approach is that the modulation can be applied directly from baseband without the need for delivering large DC current directly from the modulating source. The use of baseband to deliver the envelope assures direct software control of the envelope of the amplifier for application of the same saturated amplifier core for different modulation formats and input signals. Improved system-level control of the waveforms is then possible, thereby facilitating complementary schemes used in conjunction with the present embodiment such as phase correction feedback or adaptive predistortion.

Additional embodiments of the invention may include the use of some portion of the amplitude modulation on the phase signal, and some portion of the phase modulation on the amplitude signal 26 in order to further reduce the bandwidth requirements of those two input signals. When a filtered IQ signal is broken out into separate amplitude and phase components, those amplitude and phase components typically have much larger bandwidth than the original IQ representation. The predistortion of the amplitude signal required for generation of the desired output helps to reduce the bandwidth requirement of the amplitude signal, as it reduces the required sharp amplitude cusps that occur during the minmium of typical digital modulation waveform envelopes. Further relaxation of the bandwidth requirements can be achieved using some combination of the amplitude and phase signals on either/both of the input signals 24 and 26.

The class E amplifier topology exhibits the highest optimum load resistance of any of the amplifier topologies, which is especially important as the supply voltage is decreased and other topologies suffer from matching losses and parasitic limitations to peak efficiency. There is the potential for less power lost in impedance transformation to the 50 Ohm filter, duplexer, and antenna interfaces. Moreover, the stability of the switch-based prior art is not an issue in the present embodiments due to the low gain states of the "ON" and "OFF" states. This enables the use of lower gate dimension FET technologies for the switches whose higher IDSS enables smaller devices and die sizes, as well as faster switching speeds for high efficiency.

Figure 4:
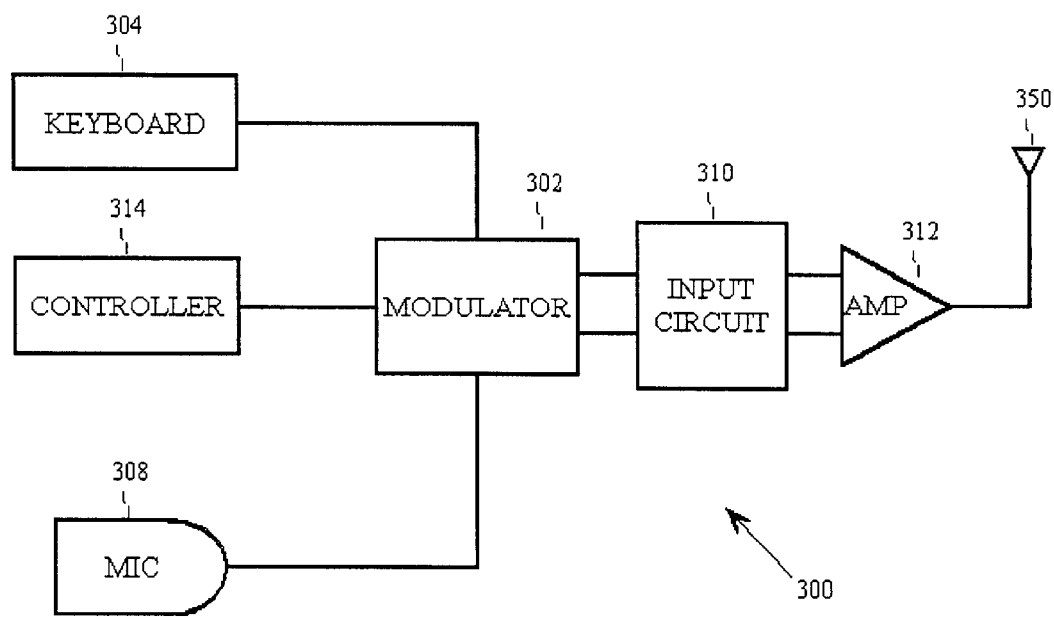
FIG. 4 is a block diagram of a communication device in accordance with the present invention.

Referring now to FIG. 4, a block diagram schematic of a communication device 300 in accordance with the present invention is illustrated. The communication device 300 is preferably a wireless transmitter used for the transmission of modulated signals. A modulator 302 receives voice input from microphone 308 and text input from keyboard 304. The signals from the microphone 308 and keyboard 304 are processed within the modulator 302 to phase modulate a carrier signal using well-known phase modulation techniques. The phase modulated signals are coupled to an input circuit 310 and processed in accordance with the embodiments described above. The resultant output is coupled to a preferably E-class amplifier 312. The output of the amplifier 312 is subsequently coupled to the antenna 350. Control device 314 preferably controls operation of the modulator 302. While only a minimum number of components are shown in the schematic of FIG. 4, one skilled in the art may readily substitute componentry or modify the circuit to provide working alternatives to the system of the present embodiment.

Of course, it should be understood that a wide range of changes and modifications can be made to the preferred embodiments described above. For example, different technologies can be used for the switching device shown in the circuits of the preferred embodiments above to exploit the capabilities and different functionality of each component. Such substitutions, taking into account the performance trade-offs of using either the upper or lower switch for modulating the envelope will be different for each case.

Thus, it is intended that the foregoing detailed description be regarded as illustrative rather than limiting, and that it be understood that it is the following claims, including all equivalents, which are intended to define the scope of this invention.

What is claimed is:

1. An active switching circuit for providing a switched waveform input to a standard class E output load matching network in an amplifier, said circuit comprising:
   a switch in communication with said input;
   a combining device receiving amplitude and phase information from a primary waveform, said amplitude and phase information being received independently from each other; and
   wherein said combining device combines said amplitude and phase information to create a control signal, said control signal being used to control said switch to create a secondary waveform for input to said matching network.

2. The circuit of claim 1 wherein said secondary waveform is an approximation of said primary waveform.

3. The circuit of claim 1 wherein said switch is a transistor having a gate, and said switch is controlled by providing said control signal at said gate.

4. The circuit of claim 1 wherein said combining device further comprises:
   a low-pass filter for receiving amplitude information from a primary waveform; and
   a high-pass filter receiving phase information from said primary waveform;
   said low-pass and high-pass filters sharing a common output in communication with said switch;
   wherein said amplitude information is passed through said low-pass filter, said phase information is passed through said high-pass filter, and said amplitude and phase information are combined at said common output.

5. The circuit of claim 1 wherein said combining device further comprises a multiplying device for combining said amplitude and phase information by multiplying said amplitude and phase information to form said control signal.

6. The circuit of claim 1 further comprising a digital signal processing device in communication with said combining device, wherein said digital signal processing device adjusts said amplitude information before it is received into said combining device to correct for distortion in said amplitude information.

7. The circuit of claim 1 further comprising:
   a digital signal processing device in communication with said combining device; and
   a feedback loop for sensing VSWR reflection from an antenna in communication with said amplifier, said feedback loop in communication with said digital signal processing device;
   wherein said digital signal processing device adjusts said amplitude information before it is received into said combining device to correct for said VSWR reflection.

8. An active switching circuit for providing a switched input to a standard class E output load matching network in an amplifier, said circuit comprising:
   a switch in communication with said matching network;
   a low-pass filter receiving amplitude information from a primary waveform; and
   a high-pass filter receiving phase information from said primary waveform;
   said low-pass and high-pass filters sharing a common output in communication with said switch;
   wherein said amplitude and phase information combine at said common output to control said switch to create a secondary waveform for input to said matching network.

9. The circuit of claim 8 wherein said secondary waveform is an approximation of said primary waveform.

10. The circuit of claim 8 wherein said switch is transistor having a gate, and said switch is controlled by providing said control signal at said gate.

11. The circuit of claim 8 further comprising a digital signal processing device in communication with said low-pass filter, wherein said digital signal processing device adjusts said amplitude information before it is received into said low-pass filter to correct for distortion in said amplitude information.

12. The circuit of claim 8, further comprising:
   a digital signal processing device in communication with said low-pass filter; and
   a feedback loop for sensing VSWR reflection from an antenna in communication with said amplifier, said feedback loop in communication with said digital signal processing device;
   wherein said digital signal processing device adjusts said amplitude information before it is received into said low-pass filter to correct for said VSWR reflection.

13. An active switching circuit for providing a switched input into a standard class E output load matching network in a class E amplifier, said circuit comprising:

a switch in communication with said matching network; and a multiplying device receiving amplitude and phase information from a primary waveform, said amplitude and phase information being received independently from each other;

wherein said multiplying device multiplies said amplitude and phase information to create a control signal, said control signal being used to control said switch to create a secondary waveform for input to said matching network.

14. The circuit of claim 13 wherein said secondary waveform is an approximation of said primary waveform.

15. The circuit of claim 13 wherein said switch is transistor having a gate, and said switch is controlled by providing said control signal at said gate.

16. The circuit of claim 13 further comprising a digital signal processing device in communication with said multiplying device, wherein said digital signal processing device adjusts said amplitude information before it is received into said multiplying device to correct for distortion in said amplitude information.

17. The circuit of claim 13 further comprising:

a digital signal processing device in communication with said multiplying device; and a feedback loop for sensing VSWR reflection from an antenna in communication with said amplifier, said feedback loop in communication with said digital signal processing device;

wherein said digital signal processing device adjusts said amplitude information before it is received into said multiplying device to correct for said VSWR reflection.

18. A method for converting a waveform into a switched input to a standard class E output load matching network in a class E amplifier, said method comprising the steps of:

separating phase and amplitude information from a primary waveform;

receiving said amplitude and phase information into a combining device;

combining said amplitude and phase information to create a control signal;

controlling an electric current through a switch in response to said control signal to create a secondary waveform; and providing said secondary waveform as an input to said matching network.

19. The method of claim 18 wherein said secondary waveform is an approximation of said primary waveform.

20. The method of claim 18 wherein said switch is a transistor having a gate, and said switch is controlled by providing said control signal at said gate.

21. The method of claim 18 wherein said combining device further comprises:

a low-pass filter for receiving amplitude information from a primary waveform; and a high-pass filter receiving phase information from said primary waveform;

said low-pass and high-pass filters sharing a common output in communication with said switch;

wherein said amplitude information is passed through said low-pass filter, said phase information is passed through said high-pass filter, and said amplitude and phase information are combined at said common output.

22. The method of claim 18 wherein said combining device further comprises a multiplying device for combining said amplitude and phase information by multiplying said amplitude and phase information to form said control signal.

23. The method of claim 18 further comprising the step of adjusting said amplitude information before it is received into said combining device to correct for distortion in said amplitude information.

24. The method of claim 18 further comprising the steps of:

a digital signal processing device in communication with said combining device; and sensing VSWR reflection from an antenna in communication with said amplifier; and adjusting said amplitude information before it is received into said combining device to correct for said VSWR reflection.

25. A method for providing a waveform for input to an matching network, said method comprising the steps of:

separating phase and amplitude information from a primary waveform;

passing said amplitude information through a low-pass filter;

passing said phase information through a high-pass filter;

combining said amplitude and phase information to create a control signal;

controlling an electric current through a switch in response to said control signal to create a secondary waveform; and providing said secondary waveform as an input to said matching network.

26. The method of claim 25 wherein said secondary waveform is an approximation of said primary waveform.

27. The method of claim 25 wherein said switch is transistor having a gate, and said switch is controlled by providing said control signal at said gate.

28. The method of claim 27 further comprising the step of adjusting said amplitude information before it is received into said low-pass filter to correct for distortion in said amplitude information.

29. The method of claim 28 further comprising:

the steps of a digital signal processing device in communication with said low-pass filter; and sensing VSWR reflection from an antenna in communication with said amplifier; and adjusting said amplitude information before it is received into said low-pass filter to correct for said VSWR reflection.

* * * * *